United States Patent [19]
DeWitt et al.

[11] Patent Number: 6,147,871
[45] Date of Patent: *Nov. 14, 2000

[54] LOW PROFILE COMPUTER ASSEMBLY USING PAIRED BACK-TO-BACK PERIPHERAL CARD CONNECTORS THAT SUPPORT DIFFERENT BUS FORM FACTORS AND ARE MOUNTED ON A RISER CARD

[75] Inventors: John R. DeWitt, Durham, N.C.; Jay Henry Neer, Boca Raton, Fla.

[73] Assignee: International Business Machines Corporation, Armonk, N.Y.

[ * ] Notice: This patent is subject to a terminal disclaimer.

[21] Appl. No.: 09/195,881

[22] Filed: Nov. 19, 1998

Related U.S. Application Data

[63] Continuation of application No. 08/536,907, Sep. 29, 1995, Pat. No. 5,926,378.
[51] Int. Cl.[7] .......................... G06F 13/40; G06F 13/42; H01R 23/70; H01R 9/09
[52] U.S. Cl. .......................... 361/752; 361/788; 395/282; 439/61
[58] Field of Search .................................... 361/729, 730, 361/796–802, 752; 211/41.17; 439/61, 55, 591, 341, 376, 377; 395/281–283

[56] References Cited

U.S. PATENT DOCUMENTS

| | | |
|---|---|---|
| 4,575,780 | 3/1986 | Brombal et al. . |
| 4,686,607 | 8/1987 | Johnson . |
| 4,703,394 | 10/1987 | Petit et al. . |
| 4,907,977 | 3/1990 | Porter . |
| 5,426,740 | 6/1995 | Bennett . |
| 5,488,541 | 1/1996 | Mistry et al. . |

FOREIGN PATENT DOCUMENTS

| | | |
|---|---|---|
| 4035212 | 5/1992 | Germany . |
| 1-84582 | 3/1989 | Japan . |

*Primary Examiner*—Jayprakash N. Gandhi
*Attorney, Agent, or Firm*—Patrick J. Daugherty; Driggs, Lucas, Brubaker & Hogg Co., L.P.A.

[57] ABSTRACT

A low profile riser card assembly for a computer system is provided by incorporating two uniaxial back to back peripheral connectors. The peripheral card connectors extend outwardly along a single axis from opposing sides of a riser card. The riser card is attached to a riser card connector mounted on the circuit board and is held in a perpendicular to the axis and in an upright position with respect to the circuit board. In the assembly of the present single invention, the uniaxial back to back peripheral card connectors are retained on the riser card in a parallel orientation with respect to the riser card connector to produce a low profile computer assembly.

12 Claims, 4 Drawing Sheets

6,147,871

LOW PROFILE COMPUTER ASSEMBLY USING PAIRED BACK-TO-BACK PERIPHERAL CARD CONNECTORS THAT SUPPORT DIFFERENT BUS FORM FACTORS AND ARE MOUNTED ON A RISER CARD

RELATED APPLICATIONS

This is a Continuation of patent application Ser. No. 08/536,907 filed Sept. 29, 1995, now U.S. Pat. No. 5,926,378.

BACKGROUND OF THE INVENTION

This invention generally relates to the field of computer system assemblies and more particularly to the assembly of circuit boards contained therein.

The increased packaging densities in today's computer assemblies along with the increase in market demand for lower profile personal computer system units has fostered the use of riser card assemblies for attaching peripheral cards to a computer system. Some such assemblies are designed such that peripheral cards attach to respective connectors on one side or on both sides of the riser card.

As shown in FIG. 1, a prior art riser card assembly 100 uses both sides of the riser card for placing staggered peripheral card connectors on the sides of a riser card. The assembly 100 includes a main circuit board 102 upon which a universal connector 105 is placed. A conventional riser card 110 with electrically conductive metallic circuit traces having a mating connector is attached to the connector 105 which holds the riser card 110 in an upright position. As shown, the riser card 110 has opposing sides 111 and 112 where each side includes one or more staggered peripheral card connectors 150 for receiving a corresponding number of peripheral cards 130. Each peripheral card 130 has a component side 131 where the electronic circuitry in the form of integrated circuit chips and discrete components are placed thereon. As depicted, the component side 131 of the peripheral cards 130 plugged into first side 111 of riser card 110 face a downwardly direction, where as, the peripheral cards 130 with components side 131 plugged into second side 112 face an upwardly direction. The conventional staggered connector arrangement utilizes connectors having rows of pins 151 which attach to the riser card via corresponding conductive through-holes formed on the opposing surfaces of the riser card 110.

However, with increased demand for lower profile computer system units, the staggered technique for placement of peripheral card connectors on either side of the riser card no longer permits the achievement of the desired packaging densities.

Furthermore, with the advent of other bus architectures such as PCI and VESA, known as local bus implementations which may be combined with other personal computer buses such as ISA, there is a need for a single computer system that supports a plurality of peripheral cards having differing form factor specifications.

SUMMARY OF THE INVENTION

Briefly, according to the invention a low profile computer assembly is provided which is capable of receiving one or more peripheral cards. The computer assembly includes a circuit board having a card connector placed thereon for receiving a riser card and holding it in an upright position in relation to the main circuit board. Two peripheral card connectors are paired together and are attached to the riser card. The two paired peripheral card connectors extend outwardly from opposing sides of the riser card. The connectors extend outwardly along a single axis which is substantially perpendicular to the riser card and in parallel to the surface of the circuit board. The assembly includes means for electrically coupling and mechanically securing the paired peripheral cards to the riser card in a parallel orientation with the card connector.

Additionally the riser card of the present inventory may have a universal footprint formed on its opposing sides for accommodating various bus form factors.

DISCLOSURE OF THE PREFERRED EMBODIMENT

Figure 1:
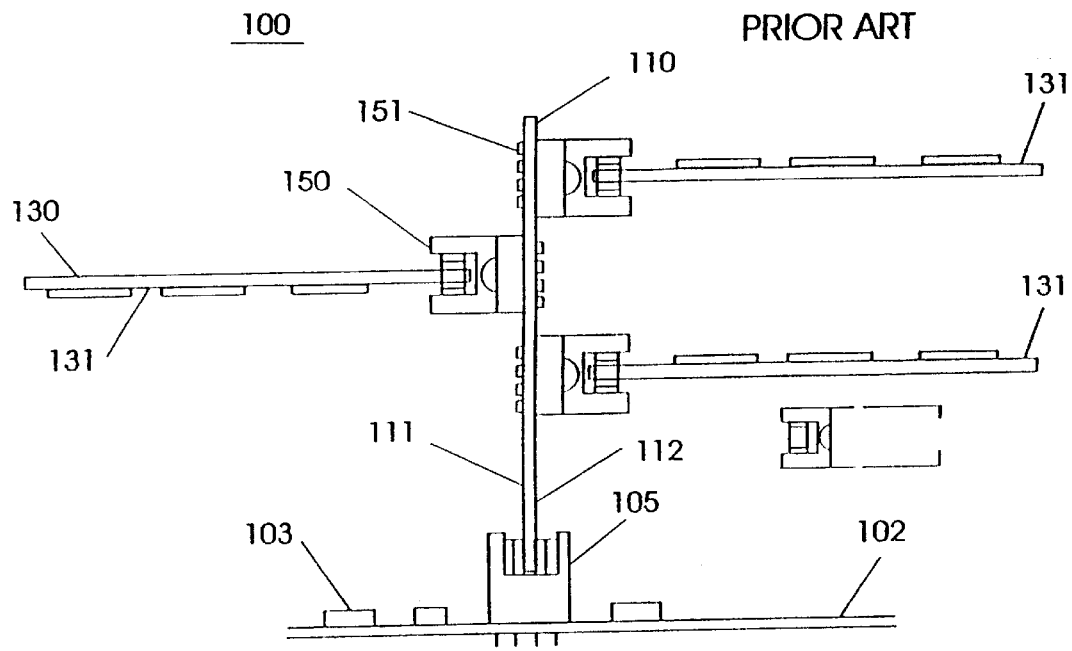
FIG. 1 is a side view of a prior art riser card having staggered peripheral card connectors.
Figure 3:
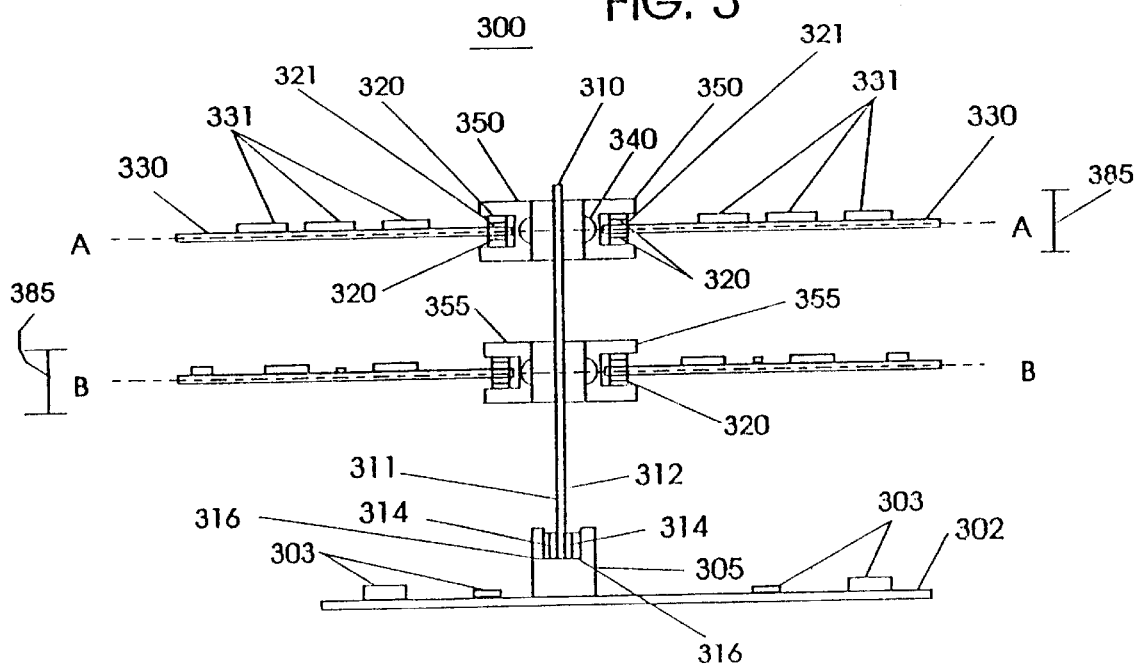
FIG. 3 is side view of a riser card assembly according to the present invention.
Figure 2:
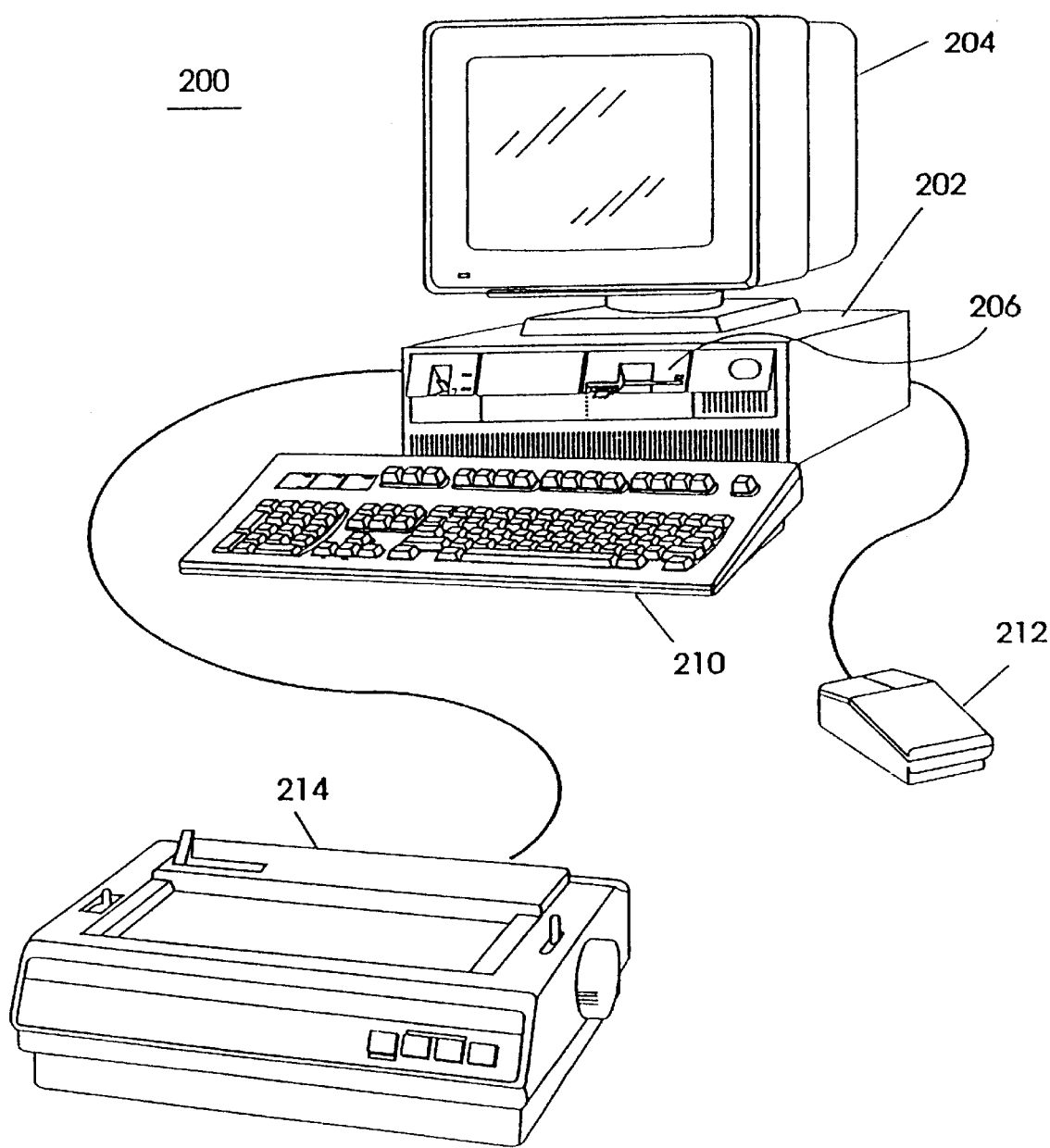
FIG. 2 is a view of an exemplary personal computer system incorporating the low profile computer assembly of the present invention.

Referring now to FIG. 2, a personal computer system 200 is shown to include a processor unit 202, a display 204, a keyboard 210, a mouse 212, a printer 214, a diskette drive 206. Incorporated within the processor unit 202 is a personal computer assembly circuit board and one or more peripheral cards, assembled according to the present invention to provide a low profile processor unit. It should be noted that, although, the exemplary computer system 200 is shown to be a desktop model where the processor unit's longest side is in a horizontal orientation with respect to its supporting surface. However, the present invention is equally applicable to a stand-up model where the processor unit's longest side is perpendicular to the supporting surface. Referring to FIG. 3, side view of a non-staggered riser card assembly 300 according to the present invention is shown. The assembly 300 includes a circuit board 302 having electrical components 303 comprising IC chips and passive and active components, being electrically connected to each other according to a specific personal computer design architecture, such as well known uni- or multi-processing system architectures. Additional and complementary functions and features are provided by attaching peripheral cards 330 to the computer system 200. Such peripheral cards 330 may for example comprise hard disk controllers for enhancing storage capacity of the computer system or communication devices for connecting the computer system of the present invention to a local or a wide area network. As is well known, the peripheral cards 330 communicate with the computer system over one or more I/O buses, where such buses comply with specified Input/Output protocols. Each bus standard also specifies a physical form factor which defines among other things, a corresponding size, shape and contact spacing. Such I/O protocols and form factors may be specified by standard specifications such as those relating to ISA, PCL SCSL or Micro Channel. The specification for each bus form factor allows peripheral card manufacturers to produce cards which could attach to corresponding peripheral card connectors of the computer system.

As shown in FIG. 3, the main circuit board 302 includes a riser card connector 305 which is placed on one of its opposing surfaces. A riser card 310 having opposing sides 311 and 312 is inserted into the card connector 305 and is held in a substantially upright position with respect to the main circuit board 302. The riser card 310 includes a plurality of peripheral card connectors 350 disposed on its opposing sides 311 and 312. A plurality of peripheral cards 330 are attached to the assembly 300 via the peripheral card connectors 350 which extend from opposing sides of the riser card 310. The riser card 310 includes a set of electrical contacts 314 formed at its connecting end for coupling to corresponding electrical contacts 316 on the card connector 305. The riser card 310 may be fabricated from an epoxy glass composite or any other suitable material with electrically conductive metallic circuit traces (Shown in FIG. 5 by reference numeral 564) The circuit traces are disposed on the riser card for electrically connecting the circuitry of the peripheral cards 330 to the circuitry disposed on the circuit board 302 via the peripheral card connector 350 and the riser card connector 305. The riser card connector 305 may be formed using thermoplastic polyester or other suitable material and attached to the main circuit board 302 via suitable electrical contacts (not shown). As such, the peripheral cards 330 are electrically connected to the circuit board 302 via, peripheral card connectors 350, the riser card 310 and the card connector 305.

According to the present invention, a low profile computer assembly is provided by situating two peripheral card connectors 350, having exemplary height(s) 385 (shown in FIG. 3), width(s) 390 and depth(s) 395 (both shown in FIG. 4) in a back to back non-staggered position with respect to each other. Each connector 350 extends outwardly from a corresponding opposing side 311 or 312 of the riser card 310 along a single axis A—A which runs perpendicular to the riser card. As such, the back to back uniaxial peripheral card connectors 350 are situated in symmetry with respect to the riser card 310. As shown, the assembly 300 may include more than one set of paired connectors, such as the back to back uniaxial pair of peripheral card connectors 355, which are similarly situated in a back-to-back uniaxial orientation and extend outwardly from the opposing sides 311 and 312 along another axis B—B which also runs perpendicular to the riser card 310. Each card connector 350 also includes symmetrically opposing contacts 320 for providing electrical connection to corresponding contacts 321 of the peripheral cards 330.

The back to back uniaxial connectors 350 (or 355) are fastened to the riser card 310 by appropriate retention means, such as screws and nuts, bonding adhesive, etc, to retain the peripheral card connectors 350 in a substantially parallel orientation with respect to the card connector 305: parallel in the sense that a longitudinal axis of a peripheral card connector, 350, is parallel to a similar longitudinal axis of the riser card connector, 305. It may be appreciated that the advantages offered by the assembly of the present invention are derived from back-to-back uniaxial position of the two peripheral cards connectors 350 and the parallel orientation of such connectors with respect to the riser card connector 305. The back-to-back arrangement of the connectors 350 eliminates the additional height introduced by prior art's staggered arrangement. In addition, the parallel orientation of the back-to-back connectors 350 with respect to the card connector 305 makes the height of the riser card independent of relatively long width 390 of the connectors 350 and thus, dependent upon substantially short height 385 of such connectors. As shown the connectors 350 are attached to the riser card 310 via an screw/nut arrangement 340.

To allow the peripheral card to operate in conjunction with the computer system of the present invention, the connector contacts 320 of the connector 350 are electrically coupled to corresponding peripheral card contacts 321. The peripheral card contacts 321 are electrically coupled to corresponding electrical contacts 314 via circuit traces 564 (shown in FIG. 5) disposed on one or both sides 311 and 312 of the riser card utilizing well known circuit board manufacturing techniques.

Figure 4:
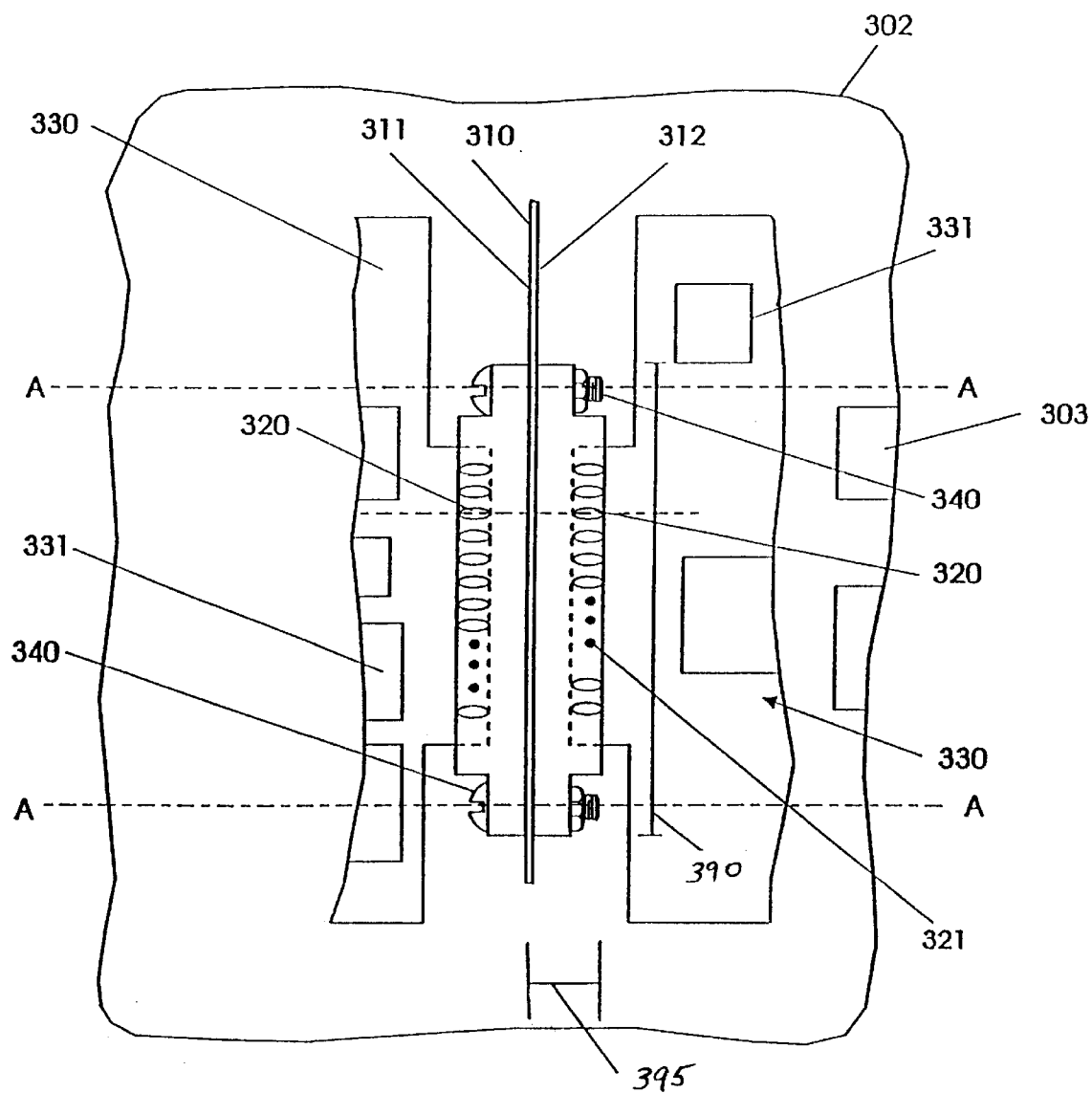
FIG. 4 is cross sectional along line A—A of FIG. 3.

FIG. 4 is a cross-sectional view, along axis A—A of FIG. 3 of two peripheral card connectors 350 as they attach to the riser card 310 in a back to back uniaxial manner according to the present invention. As shown, the peripheral card connectors 350 extend outwardly from the opposing sides 311 and 312 of the riser card 310 along axis A—A and connect to the peripheral cards 330 to the riser card from one side and to the riser card 310 from the other side. The peripheral card connector 350 attached to the riser card circuitry via suitable contacts (not shown). This arrangement positions the peripheral cards 330 in symmetrical situation with respect to the riser card 310. Also shown are peripheral card connector contacts 320, and corresponding peripheral card contacts 321 which produce the electrical connection between the computer system 200 and the peripheral cards 330.

The peripheral card connectors 350 may be provided in a variety of arrangements. For example, the peripheral card connectors 350 may be integrated into a single solid piece, such as a molded piece, allowing them to extend outwardly from the opposing sides of the riser card 310 in accordance with the present invention Obviously, in this integrated arrangement, suitable openings must be formed on the riser card 310 to allow the peripheral card connectors 350 to be positioned in substantial symmetry with respect to the riser card 310. The electrical contacts 320 may be formed at the opposing ends of the connector 350 utilizing well known molding, electroplating or other suitable connector placement techniques. The electrical contacts 320 of the connector 350 are positioned and spaced in accordance with corresponding bus form factor.

For example, for an ISA, PCI or Micro Channel peripheral card the connector 350 and its electrical contacts 320 may be disposed at opposing surfaces in accordance with their corresponding form factor definition. Alternatively, the peripheral card connectors 350 may be positioned against each other in a back to back uniaxial arrangement. As such that the opposing contacts 320 extend outwardly along the axis A—A while the peripheral card when attaches is positioned perpendicular to the riser card 310 and in parallel to the circuit board 302. FIG. 4 also shows a mechanical fastening arrangement for attaching the connector 350 to the riser card utilizing threaded screws, with corresponding nuts for holding the connectors 350 in parallel orientation with respect to the riser card connector 305. However, as described above other suitable fastening means, such as rivets, bonding adhesives, etc., may be used in lieu of the depicted arrangement.

Moreover, it is contemplated that the computer system 200 of the present invention be capable of supporting one or more peripheral cards with the same or differing I/O bus form factors in any combination. Thus, it may be appreciated that each of the back to back peripheral card connectors 350 may be conforming to identical or non-identical form factors. For example, the bus form factor on one side of the riser card 310 may conform to ISA standard while the form factor of the other side may conform to PCI, or Micro Channel standard. As such, peripheral cards supporting various I/O configurations may be attached to one or both sides of the riser card 310.

Figure 5:
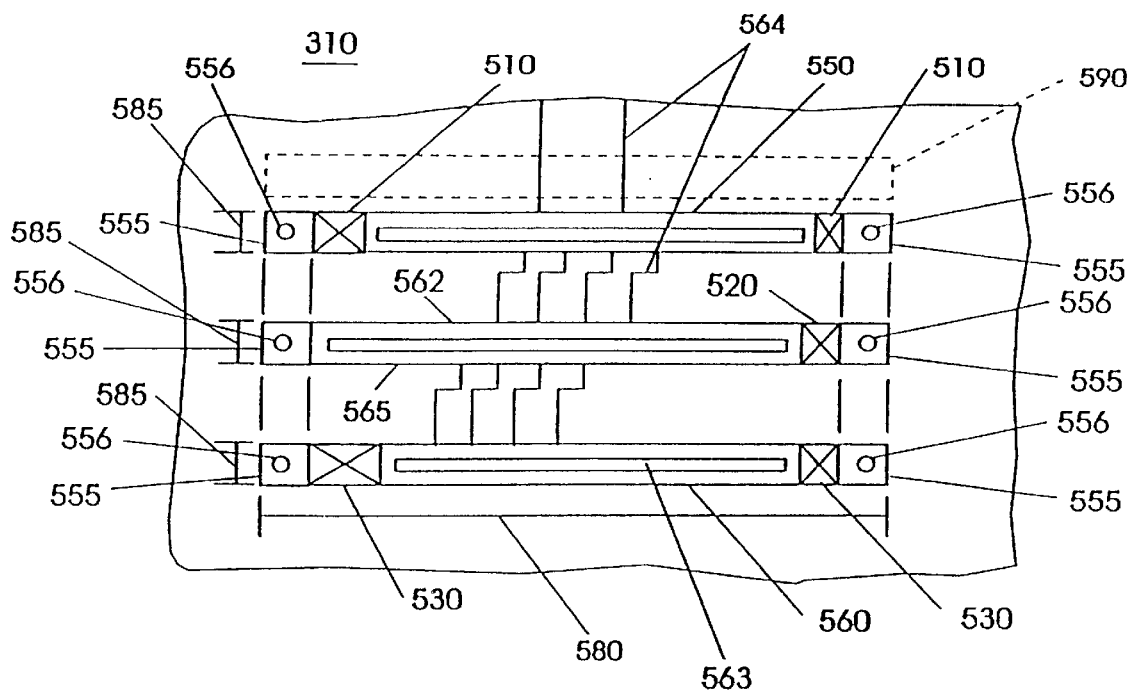
FIG. 5 is front view of the riser card of FIG. 3 showing peripheral card connectors for various buses.

Referring to FIG. 5, a plan view of one side of the riser card 310 is shown to include a plurality of similarly situated connectors 550, 560, and 565. FIG. 5 also illustrates that because of parallel orientation of the peripheral card connectors 350 to riser card connector 305, a number of parallel pairs of peripheral card connectors may be disposed on the riser card 310 with said number being a function of relatively short height 585 of the universal foot print 590 and independent of relatively long width 580 of the universal foot print of the riser card. Thus allowing a relatively large number of paired back to back peripheral card connectors being disposed on the riser card 310 with its height maintained at a minimum. As shown, the connectors 550, 560, and 565 accommodate various I/O form factors while maintaining a uniform and universal peripheral card foot print on the riser card 310 for positioning the back to back uniaxial connectors 350. By maintaining a universal foot print on the riser card 310 various bus form factors may be accommodated in one or both sides of the riser card 310 while maintaining uniformity in positioning the peripheral card connectors in a back to back uniaxial manner. This arrangement greatly simplifies the attachment requirement of the peripheral card connectors to the riser card as such attachment arrangements could be uniformly applied to support various bus form factors. It should be noted that the dimensions and shapes shown of various buses are exemplary and do not necessarily illustrate the actual shapes and form factors of the buses discussed. As shown, pre-defined extension areas 510, 520, and 530 are disposed around the geometry of peripheral card connectors 550, 560, and 565 to respectively accommodate a PCI bus 561, an ISA/EISA bus 562 and Micro Channel bus 563 where such form factors and their respective extensions form universal foot prints 590 on the riser card (shown with dotted line). According to this aspect of the present invention, the extension areas of each connector form a universal riser card foot print having identical width 580 and height 585 width while accommodating various I/O form factors. It may be appreciated that the position, size and geometry of the extension areas are defined by the physical specification of a corresponding form factor it accommodates and the specification of the universal riser card foot print 590. At each end of the foot print 590, end blocks 555 are formed having openings 556 to accommodate uniform fastening of the peripheral connectors 550, 560, and 565 using identical threaded screws and corresponding nuts. As shown, circuit traces 564 are disposed on the riser card for coupling various components including the peripheral card connectors to each other and the riser card connector 305.

Figure 6:
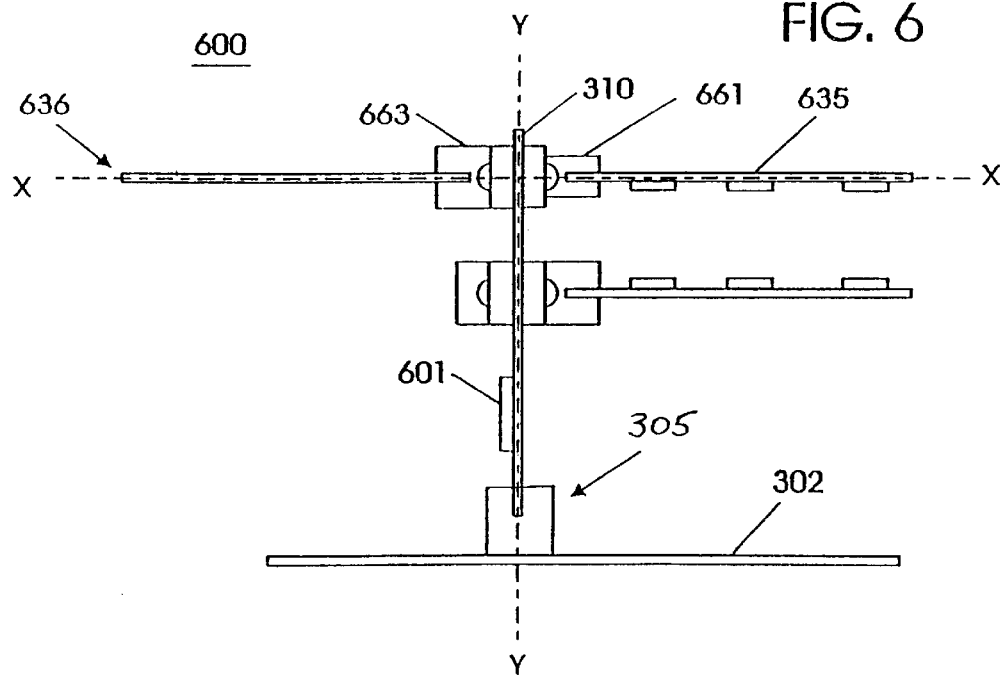
FIG. 6 is side view of another embodiment of the computer assembly according to the present invention with a bus bridge chip.

Referring to FIG. 6, another embodiment of an assembly 600 according to the present invention is shown to include an I/O bus bridge chip 601 placed on the riser card 310. This arrangement allows functional interface between one I/O bus protocol to another I/O bus protocol on the riser card 310 itself This arrangement greatly enhances support of various I/O bus combinations on the computer system of the present invention. That is, various I/O bus combinations may be supported by the computer system 200 by simply attaching a suitable riser card 310 to the card connector 305. For example, a system supporting PCI and Micro Channel buses, may utilize a riser card having PCI/Micro Channel bus bridge chip. As such, the I/O bus support configuration of such system may be easily changed to for example, a system supporting PCI and ISA buses, by replacing the previously attached riser card with one having an ISA/PCI bus bridge chip. As shown, an exemplary Micro Channel peripheral card connector 663 and an exemplary PCI peripheral connector 661 may be positioned in a back to back uniaxial orientation and the bus bridge chip 601 is placed in close proximity on the riser card 310. The assembly 600 provides another advantage in that the close proximity of the PCI peripheral connector 661 and Micro Channel peripheral connector 663 enables peripheral cards 635 and 636 to share data with each other over a much shorter distance thus contributing to the reliability of data transfers over the respective buses.

It should be pointed out that even though, the depicted assembly of the present invention is directed toward a desktop personal computer model where the circuit board is substantially parallel to the supporting surface of the computer system, the assembly of the present invention could also be incorporated in a stand-up computer model when the circuit board is substantially perpendicular to the supporting surface of the computer system.

What is claimed is:

1. A low profile computer assembly, comprising:

a circuit board having opposing major surfaces, wherein at least one of said major surfaces includes electrical circuitry disposed thereon;

a riser card connector mounted on one of said circuit board major surfaces and being electrically connected to said electrical circuitry;

a riser card having opposing first and second sides, said riser card attached to said riser card connector and held substantially perpendicular to said circuit board, wherein said riser card includes riser card traces disposed on at least one of said opposing sides of said riser card for electrically coupling to said electrical circuitry of said circuit board through said riser card connector;

a first edge-card peripheral card connector mounted on said first side of said riser card, said first peripheral card connector extending substantially perpendicularly outward from said first side such that said connector is held substantially parallel with respect to said circuit board major surfaces, wherein said first edge-card peripheral card connector includes edge-card peripheral card contacts electrically coupled to some of said riser card traces, wherein said first edge-card peripheral card connector supports a first bus form factor for a first peripheral bus conforming to a first bus protocol specification; and a second edge-card peripheral card connector mounted on said second, opposite side of said riser card such that said first and second peripheral card connectors are mounted directly opposed from one another on said first and said second sides of said riser card, whereby said first and second peripheral card connectors are held substantially parallel with respect to said circuit board major surfaces along a single axis, wherein said second edge-card peripheral card connector includes edge-card peripheral card contacts electrically coupled to some of said riser card traces, and wherein said second edge-card peripheral card connector supports a second bus form factor for a second peripheral bus conforming to a second bus protocol specification.

2. The low profile computer assembly of claim 1, wherein said first and second bus form factors are different, and wherein said first and second bus protocol specifications are different.

3. The low profile computer assembly of claim 2 further comprising an I/O bus bridge circuit placed on said riser card and providing an interface between said first bus protocol and said second bus protocol.

4. The low profile computer assembly of claim 2, wherein said first edge-card peripheral card connector supports a first bus form factor for a first peripheral bus conforming to the peripheral card interconnect (PCI) bus protocol specification and wherein said second edge-card peripheral card connector supports a second bus form factor for a second peripheral bus conforming to the industry standard architecture (ISA) bus protocol specification.

5. The low profile computer assembly of claim 4 further comprising an I/O bus bridge circuit placed on said riser card and providing an interface between said PCI bus protocol and said ISA bus protocol.

6. The low profile computer assembly of claim 1, further comprising:
- a first peripheral card mounted in said first edge-card peripheral card connector conforming to said first bus protocol specification and said first bus form factor, said first peripheral card including first and second peripheral card sides and having first peripheral card circuitry disposed on at least one of said first or second peripheral card sides, said first peripheral card circuitry electrically connected to said electrical circuitry via said first peripheral card connector, said riser card and said riser card connector; and
- a second peripheral card mounted in said second edge-card peripheral card connector conforming to said second bus protocol specification and said second bus form factor, said second peripheral card including third and fourth peripheral card sides and having second peripheral card circuitry disposed on at least one of said third or fourth sides, said second peripheral card circuitry electrically connected to said electrical circuitry via said second peripheral card connector, said riser card and said riser card connector.

7. A low profile computer assembly, comprising:
- a circuit board having opposing major surfaces for disposing electrical circuitry on at least one of said major surfaces, and a riser card connector placed on at least one of said circuit board major surfaces and being electrically connected to said electrical circuitry;
- a riser card having opposing sides, said riser card attached to said riser card connector and held substantially perpendicular to said circuit board, wherein said riser card includes riser card traces disposed on at least one of said opposing sides of said riser card for electrically coupling to said electrical circuitry of said circuit board through said card connector; and
- first and second peripheral card connectors integrated into a single solid piece, each of said peripheral card connectors extending outwardly from a respective side of said riser card, wherein said first and second peripheral card connectors extend outwardly along a single axis which runs substantially perpendicular to said riser card and substantially in parallel to said circuit board major surfaces, said peripheral card connectors including peripheral card contacts electrically coupled to some of said riser card traces; and
- wherein said riser card has an opening formed therein to allow said first and second peripheral card connectors to be positioned in substantial symmetry with respect to said riser card.

8. The low profile computer assembly of claim 7, wherein said first peripheral card connector supports a first bus form factor for a first peripheral bus conforming to a first bus protocol specification, wherein said second peripheral card connector supports a second bus form factor for a second peripheral bus conforming to a second bus protocol specification, wherein said first and second bus form factors are different, and wherein said first and second bus protocol specifications are different.

9. The low profile computer assembly of claim 8 further comprising an I/O bus bridge circuit placed on said riser card and providing an interface between said first bus protocol and said second bus protocol.

10. A low profile computer assembly, comprising:
- a circuit board having opposing major surfaces for disposing electrical circuitry on at least one of said major surfaces, and a riser card connector placed on at least one of said circuit board major surfaces and being electrically connected to said electrical circuitry;
- a riser card having opposing sides, said riser card attached to said riser card connector and held substantially perpendicular to said circuit board, wherein said riser card includes riser card traces disposed on at least one of said opposing sides of said riser card for electrically coupling to said electrical circuitry of said circuit board through said card connector; and
- first and second edge-card peripheral card connectors mounted back-to-back with respect to each other, each of said edge-card peripheral card connectors extending outwardly from a respective side of said riser card, wherein said first and second edge-card peripheral card connectors extend outwardly along a single axis which runs substantially perpendicular to said riser card and substantially in parallel to said circuit board major surfaces, said edge-card peripheral card connectors including peripheral card contacts electrically coupled to some of said riser card traces; and
- wherein said first edge-card peripheral card connector supports a first bus form factor for a first peripheral bus conforming to a first bus protocol specification, wherein said second edge-card peripheral card connector supports a second bus form factor for a second peripheral bus conforming to a second bus protocol specification, wherein said first and second bus form factors are different, and wherein said first and second bus protocol specifications are different.

11. The low profile computer assembly of claim 10, wherein said first edge-card peripheral card connector supports a first bus form factor for a first peripheral bus conforming to the peripheral card interconnect (PCI) bus protocol specification and wherein said second edge-card peripheral card connector supports a second bus form factor for a second peripheral bus conforming to the industry standard architecture (ISA) bus protocol specification.

12. The low profile computer assembly of claim 10 further comprising an I/O bus bridge circuit placed on said riser card and providing an interface between said first bus protocol and said second bus protocol.

* * * * *